United States Patent
Shaeffer et al.

(10) Patent No.: US 7,764,715 B2
(45) Date of Patent: Jul. 27, 2010

(54) CIRCUITS AND METHODS FOR DATA MULTIPLEXING

(75) Inventors: Derek Shaeffer, Redwood City, CA (US); Michelle Lee, Santa Clara, CA (US); Hai Tao, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 1396 days.

(21) Appl. No.: 10/623,028

(22) Filed: Jul. 17, 2003

(65) Prior Publication Data

US 2004/0042503 A1    Mar. 4, 2004

Related U.S. Application Data

(60) Provisional application No. 60/407,558, filed on Aug. 30, 2002.

(51) Int. Cl.
*H04J 3/12* (2006.01)
(52) U.S. Cl. .................. 370/519; 370/503; 375/360
(58) Field of Classification Search ............. 370/535, 370/538, 536, 537, 503, 516, 517, 518, 519, 370/371, 350; 375/360, 354, 373
See application file for complete search history.

(56) References Cited

U.S. PATENT DOCUMENTS

| 5,052,028 | A | * | 9/1991 | Zwack .................. 375/358 |
| 5,488,641 | A | * | 1/1996 | Ozkan .................. 375/374 |
| 5,534,805 | A | * | 7/1996 | Miyazaki et al. ........... 327/144 |
| 5,850,422 | A | * | 12/1998 | Chen .................. 375/371 |
| 6,278,755 | B1 | * | 8/2001 | Baba et al. ............. 375/360 |
| 6,917,660 | B2 | * | 7/2005 | Song .................. 375/373 |
| 6,973,151 | B2 | * | 12/2005 | Lysdal et al. ............ 375/371 |
| 7,221,126 | B1 | * | 5/2007 | Williamson et al. ........ 370/503 |

* cited by examiner

*Primary Examiner*—Jason E Mattis
*Assistant Examiner*—Dady Chery
(74) *Attorney, Agent, or Firm*—Workman Nydegger

(57) ABSTRACT

A method and apparatus for data multiplexing is capable of high-speed operation with acceptable timing margins and has reduced sensitivity to supply voltage, temperature, manufacturing and other variations. One implementation relates to a data multiplexer that has no significant speed limitation associated with the clock-to-data delay of data latches, flip-flops, etc. In one implementation, clock-to-data delay is compensated for by introducing a delay-compensator in the clock line that drives a selector stage of the multiplexer. In one such implementation, a timing relationship is established between clock and data waveforms by timing the data waveforms with a first in-phase clock and operating the delay-compensated selector clock line with a second clock, which is delayed with respect to the first clock. The second clock can have a quadrature-phase delay with respect to the in-phase clock.

25 Claims, 7 Drawing Sheets

US 7,764,715 B2

CIRCUITS AND METHODS FOR DATA MULTIPLEXING

RELATED UNITED STATES APPLICATION

This application claims priority to U.S. Provisional Patent Application Ser. No. 60/407,558 filed on Aug. 30, 2002, by Derek Shaeffer and Michelle Lee, entitled "Method and Apparatus for Data Multiplexing," and assigned to the assignee of the present application.

FIELD OF THE INVENTION

An embodiment of the present invention relates to the field of data transmission. More specifically, embodiments of the present invention relate to circuits and methods for data multiplexing.

BACKGROUND OF THE INVENTION

Modern computing, networking, communications, and other technologies can require several streams of data to be transmitted across a single medium during the same time period. Multiplexing can effectuate such transmission, such as where multiple streams of data at a particular data rate are combined into a single stream of data at a higher data rate.

A conventional two-to-one multiplexer is shown in Prior Art FIG. 1. In this multiplexer, two data streams, labeled D1 and D2, are combined into a single data stream by a selector 101. Selector 101 is operated (e.g., controlled) by a clock signal, labeled CLK in the diagram. When clock CLK is at a low logic level, the data signal D1 is passed to the output line, labeled D3. When the signal CLK is high, the data signal D2 is passed to the output line D3. Thus, the output line alternates between signals D1 and D2, and the two input data signals are combined into a single data stream.

To maintain the integrity of the output data, it is desirable for signal D1 to be stable during the interval when CLK is low. For this reason, the data signal D1 is provided by a first data latch 102, whose output only changes after each rising edge of CLK. This timing relationship is illustrated in timing diagram 103, which shows that transitions 106 of the data signal D1 occur in response to each rising edge of the CLK signal. Provided that the transitions in data signal D1 are completed before the falling edge of CLK, D1 is stable during intervals when the CLK signal is low. This condition will be satisfied provided the clock-to-data delay (sometimes called "clock-to-Q" delay) of data latch 102 is less than half of the repetition period of the CLK signal.

Similarly, when CLK is high, it is desirable for signal D2 to be stable. To achieve this, D2 is provided by a second data latch 104, whose output only transitions in response to each falling edge of CLK, with the requirement that the transition be completed prior to the rising edge of CLK. This timing relationship is also illustrated in the timing diagram 103. A third latch 109 delays D2 by one half clock cycle, relative to D1. In the present discussion, the term "latch" refers to either a latch or a flip-flop. A flip-flop can comprise two inter-coupled, co-operational latches. As used herein, the term can refer to other logic circuit elements as well.

Conventional multiplexer 101 can be subject to an operating limitation at high frequencies. At high frequencies, the delay between the rising edge of CLK and a data transition on signal D1 can become comparable to or greater than half of the clock period. If such a condition occurs, the falling edge 105 of CLK, which marks the beginning of the CLK low period, may arrive before the transition 106 in data signal D1 is complete. Such a situation would violate the desired condition that D1 be stable while the CLK signal is low. This violation can cause the output data D3 to be corrupted.

A similar problem can occur on the rising edge of the clock signal if the delay of data latch 104 becomes correspondingly too long. In this case, the data signal D2 may still be in transition when clock signal CLK is high, which can also cause the output data D3 to be corrupted.

The delay from clock-to-data in a data latch, sometimes referred to as "clock-to-Q delay," can depend on operational, pre-operational, environmental, and other variables. Such variables can include, but are not limited to, variations in temperature, power supply voltage, manufacturing process, and fabrication. These variables can subject the performance of the multiplexer to variations that are not well controlled, and which can be undesirable. For example, a multiplexer that functions adequately at room temperature and nominal supply voltage may exhibit corrupt output data (e.g., fail to function adequately) at elevated temperature or reduced voltage.

SUMMARY OF THE INVENTION

A circuit and method for data multiplexing are disclosed. A multiplexer according to one embodiment is capable of high-speed operation with acceptable timing margins and has reduced sensitivity to supply voltage, temperature and manufacturing variations. One embodiment of the present invention relates to a data multiplexer that has no significant speed limitation associated with the clock-to-data (e.g., clock to Q) delay of data latches, flip-flops, and like devices.

In one embodiment, clock-to-data delay is compensated for by introducing a delay-compensator. In one embodiment a buffer in the clock line that drives a selector stage of the multiplexer comprises the delay compensating mechanism. A timing relationship is established between clock and data waveforms by timing the data waveforms with a first in-phase clock and operating the delay-compensated selector clock line with a second clock. The second clock has a fixed delay with respect to the first clock. In one embodiment, the second clock comprises a quadrature-phase clock, the signal of which is displaced in time with respect to the first in-phase clock by one quarter clock period. In another embodiment, the second clock signal is displaced in time with respect to the first in-phase clock by other than one quarter clock period. In one embodiment, the second clock signal is displaced in time with respect to the first in-phase clock by approximately one quarter clock period.

BRIEF DESCRIPTION OF THE DRAWINGS

Prior Art

DETAILED DESCRIPTION OF THE INVENTION

Circuits and methods for data multiplexing are disclosed. A multiplexer implemented according to embodiments of the present invention is capable of high speed operation and exhibits significant insensitivity to supply voltage, temperature and manufacturing process variations. Features of the invention are well-suited for higher-speed multiplexing applications (for example, in high-speed optical networking systems), and overcome timing constraints that can affect such systems.

Conventional multiplexers can experience a reduction in timing margin at high frequencies due to the variable delay from clock-to-data (e.g., clock-to-Q) in data latches (e.g., flip-flops or other logic circuit elements). This reduction in timing margin can effectively limit the operating frequency to less than half of the inverse of the worst-case clock-to-data delay of a data latch. One embodiment of the present invention addresses this problem by compensating for the variable delay in the data latches and providing a second clock signal, which is delayed with respect to the first (e.g., in-phase) clock signal, to control selection of data to be multiplexed. In one embodiment, the second, delayed clock signal comprises a quadrature-phase clock, the signal of which is displaced in time with respect to the first in-phase clock by a quarter clock cycle (e.g., 90 degrees). This can effectuate a fixed timing relationship to the data signals for operating a selector comprising the multiplexer that improves performance at high frequencies. In another embodiment, the second clock signal is displaced in time with respect to the first in-phase clock by other than one quarter clock period. In one embodiment, the second clock signal is displaced in time with respect to the first in-phase clock by approximately one quarter clock period.

It is appreciated that, although described in the context of latches, embodiments of the present invention can be used with flip-flops and other binary circuit elements, logic circuit elements, and other such devices. Generally speaking, the terms "logic circuit element" or "binary circuit element" include logic and circuit elements that maintain, or alternate between, one of two states (e.g., a binary zero and a binary one). However, for the sake of simplicity of discussion, embodiments of the invention are described using the term "latches."

It is also appreciated that, although described for a multiplexer, embodiments of the present invention may be used with other types of devices that perform the same general function as a multiplexer; that is, the selection of a signal from one or more of a plurality of input (e.g., data) lines.

Figure 1:
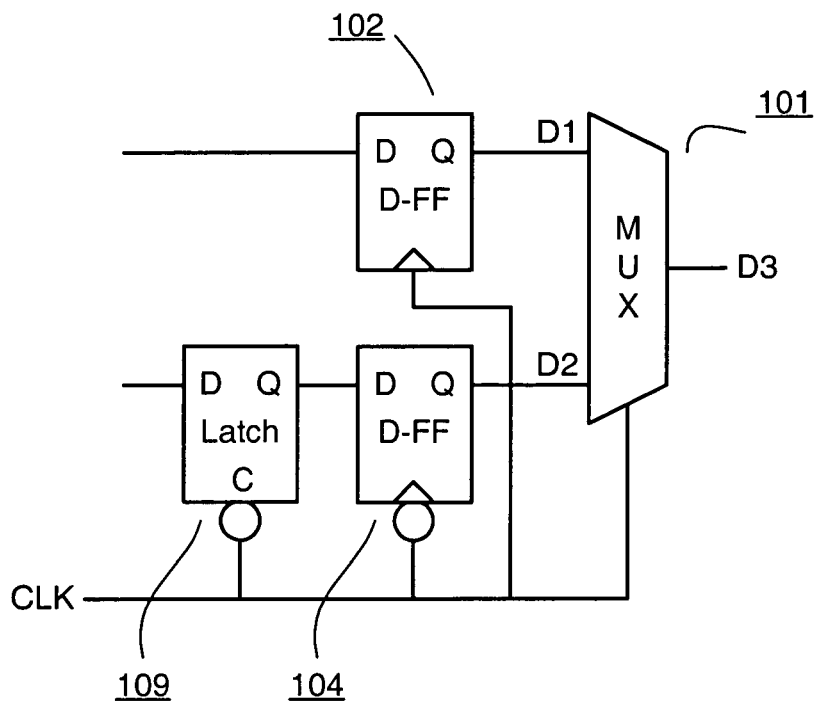
FIG. 1 depicts a conventional data multiplexer and associated timing diagram.
Figure 1:
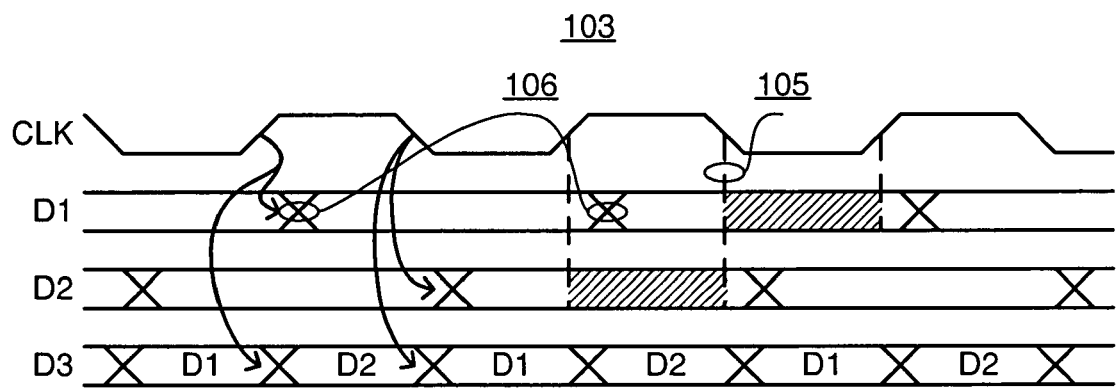
Figure 2:
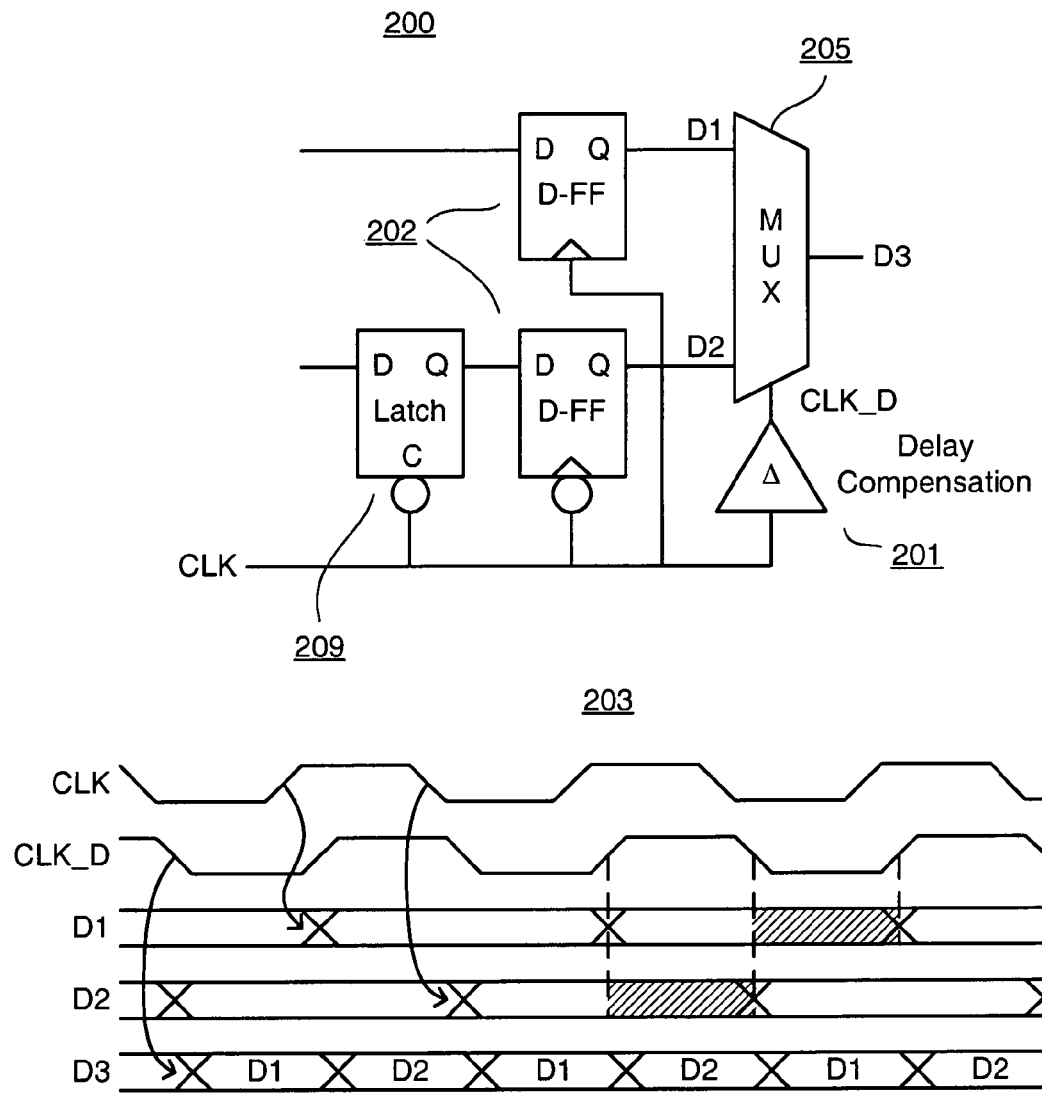
FIG. 2 depicts a multiplexer with a delay-compensating clock buffer and an associated timing diagram, according to one embodiment of the present invention.

FIG. 2 illustrates a multiplexer 200 employing delay compensation. A delay-compensating buffer 201 is in series with the clock signal CLK and the selector 205 in multiplexer 200. Where the delay of the buffer 201 is chosen to approximately match the clock-to-data delay of the first and second data latches 202, the resulting delayed clock CLK_D has edges that are approximately aligned with transitions in the input data streams D1 and D2, as illustrated in timing diagram 203. A third latch 209 delays D2 by one-half clock cycle, relative to D1.

It is advantageous for delay compensating buffer 201 to have a delay approximately matching the clock-to-data delay of the data latches over voltage, temperature, manufacturing process and other variations. Such matching provides a fixed timing relationship between clock and data waveforms in multiplexer 200. The condition wherein the delay of the compensating buffer 201 approximately matches the clock-to-data delay of latches 202 is referred to "full delay matching" for convenience. There are several ways that one can achieve such delay matching in practice.

For instance, full delay matching between clock and data waveforms can be achieved by a replica technique, known in the art. Replica delay matching can be effectuated by constructing delay compensating buffer 201 using circuitry that effectively duplicates the circuitry in the data latches 202. Advantageously, with replica delay matching, the compensated clock edges track the data transition edges as conditions vary so that the relative timing of the edges is held approximately constant (e.g., effectively invariant with respect to each other). Other techniques for providing matched delays can also be used.

However, there is a disadvantage to using full delay matching. As illustrated in FIG. 2, when full delay matching is achieved, the data and clock transitions are approximately aligned. In practice, achieving perfect alignment over process, temperature and voltage may not strictly be possible. For instance, a residual mismatch can exist between the clock-to-data delay of the data latches 202, and the delay of the buffer 201. However, because the delay compensation nominally aligns the clock and data edges, there is no timing margin remaining for variation or mismatch between the delays. This lack of margin may cause the output data D3 to be corrupted as conditions vary. To address the possibility of such a residual mismatch while retaining the advantages of full delay matching, an additional, fixed delay can be introduced to position the clock and data transitions for maximal timing margin.

Figure 3:
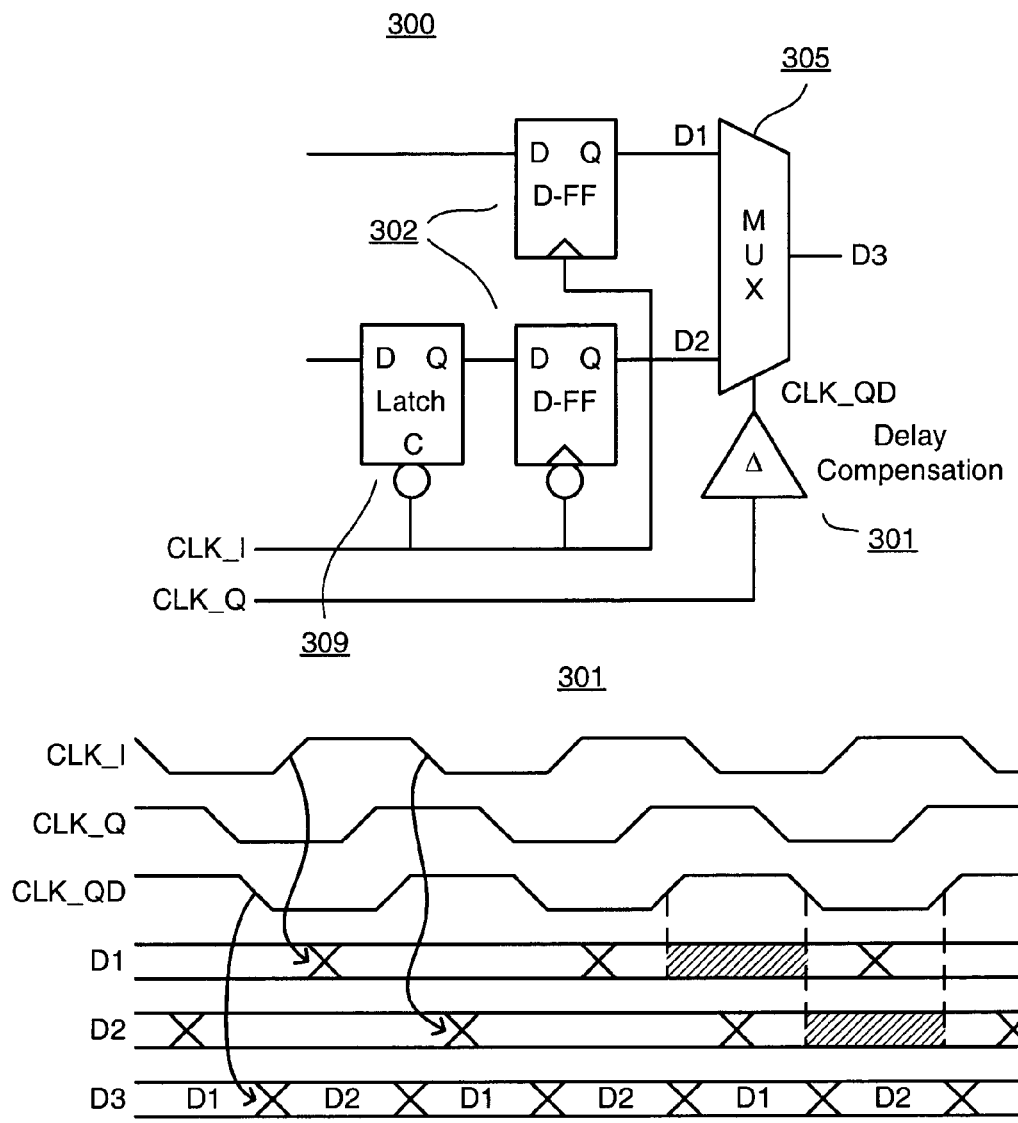
FIG. 3 depicts a multiplexer and an associated timing diagram, according to one embodiment of the present invention.

An embodiment of the present invention that provides an additional fixed timing delay while retaining the advantage of a fixed clock and data timing relationship imparted by the use of full delay compensation is shown in FIG. 3. FIG. 3 depicts a multiplexer 300, according to one embodiment of the present invention. Multiplexer 300 makes use of an additional clock signal CLK_Q to operate selector 305. The clock signal CLK_Q is offset or delayed by a fixed amount of time with respect to the initial clock signal, now referred to as CLK_I. As described above, CLK_I is in-phase with the transitions of latches 302 and the data signals D1 and D2.

Figure 4:
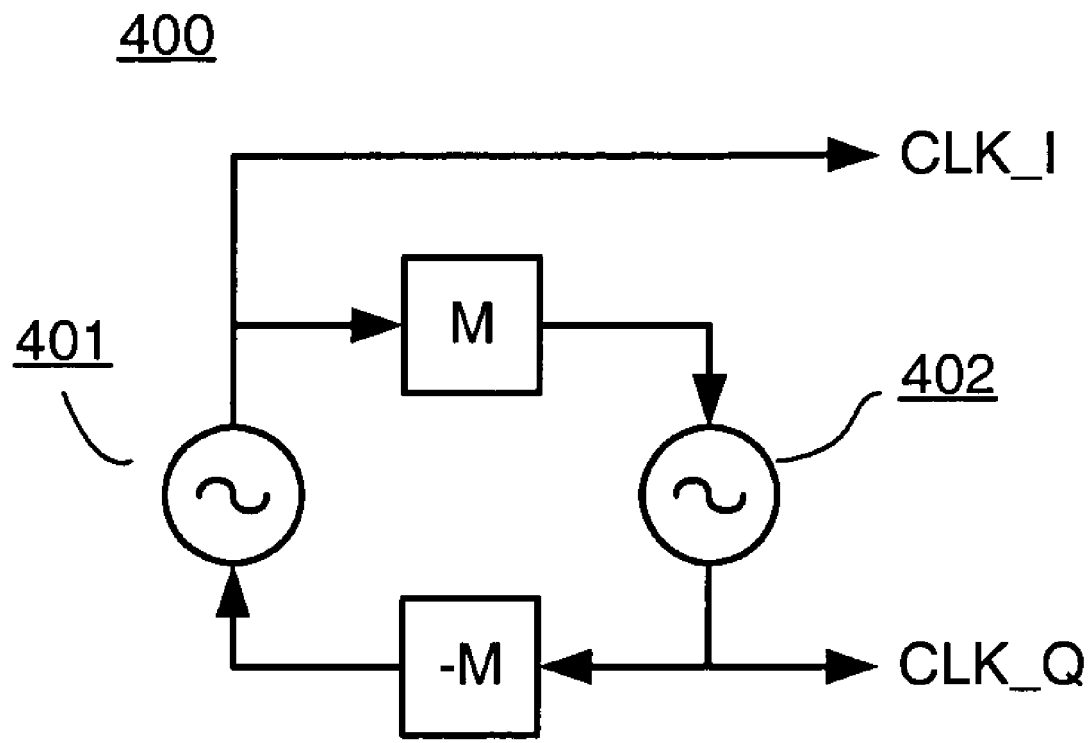
FIG. 4 depicts a coupled oscillator fixed delay clock generator, according to one embodiment of the present invention.
Figure 5:
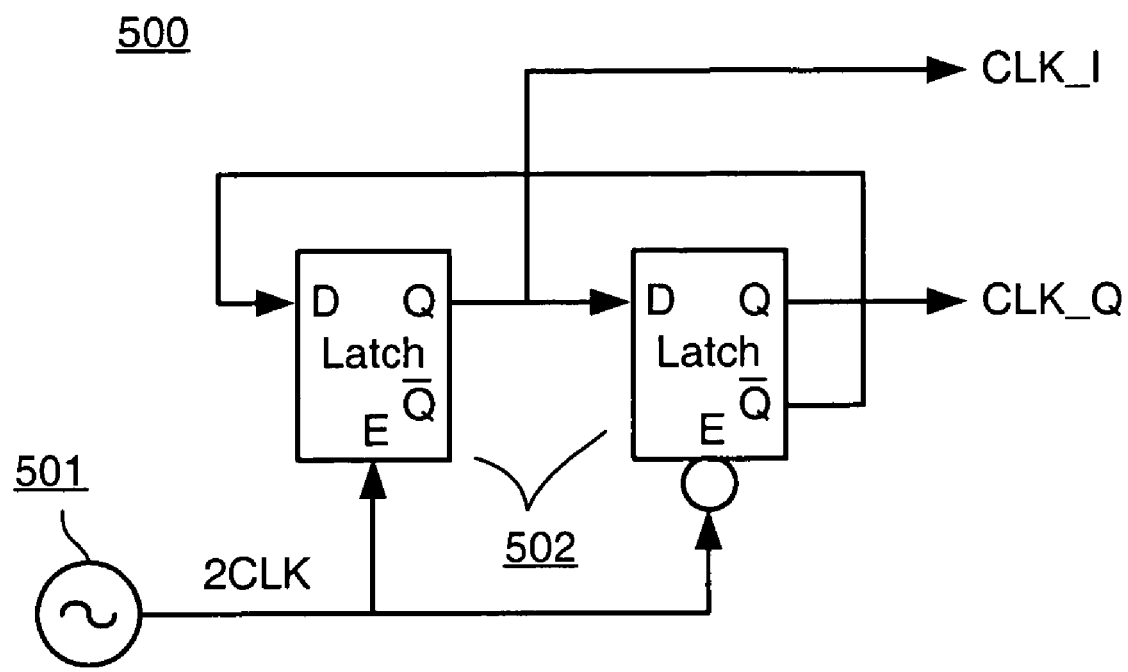
FIG. 5 depicts a divider fixed delay clock generator, according to one embodiment of the present invention.
Figure 6:
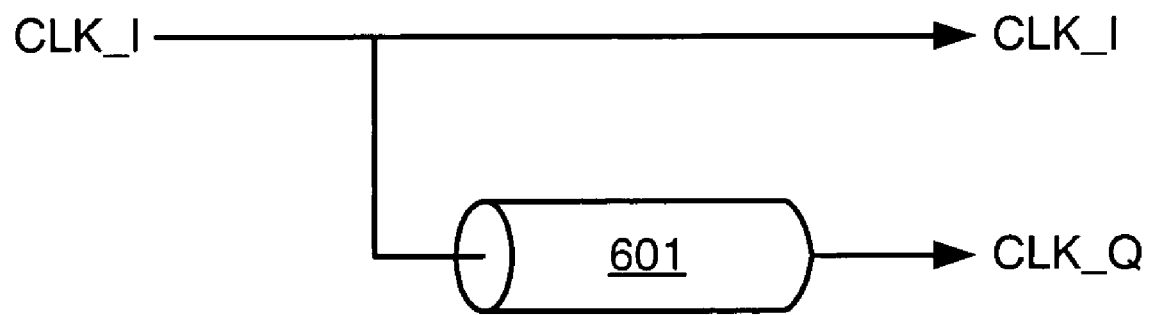
FIG. 6 depicts a propagation delay fixed delay clock generator, according to another embodiment of the present invention.

In one embodiment, CLK_Q is a quadrature clock signal generated by a quadrature clock generator (e.g., quadrature clock generators 400, 500, 600; FIGS. 4, 5, 6, respectively). A third latch 309 delays D2 by one half clock cycle, relative to D1. In another embodiment, CLK_Q is delayed by a fixed amount other than a quadrature delay.

The use of a quadrature clock signal CLK_Q is advantageous in that it has a fixed timing relationship with respect to the in-phase clock signal CLK_I. For instance, a quadrature clock has a rising edge that is shifted by a quarter of the clock period (e.g., 90 degrees) with respect to the rising edge of the in-phase clock. The quadrature clock is delayed by the delay compensating buffer 301 and applied to the selector 305 control port. As shown in the timing diagram 303, the delay-compensated quadrature clock is positioned so that its active-low and active-high intervals occur in the middle of the stable intervals of data signals D1 and D2. Advantageously, this timing relationship between the selector clock CLK_Q and input data D1 and D2 maximizes the timing margin and the stability of the timing relationship and enables reliable, high speed operation with minimal sensitivity to the supply voltage, temperature, process and other variations that can occur in practice.

The use of a quadrature clock signal CLK_Q is further advantageous in that the fixed timing relationship with respect to the in-phase clock signal is a fixed fraction of the clock period, independent of the operating frequency. This property stabilizes the selector clock alignment over a wide range of operating frequencies and effectively substantially eliminates the multiplexer speed limitation arising from finite clock-to-data delay in the data latches.

In another embodiment, the second clock signal is displaced in time with respect to the first in-phase clock by other than one quarter clock period. In one embodiment, the second clock signal is displaced in time with respect to the first in-phase clock by approximately one quarter clock period. For clarity and brevity, the term "quadrature" is used herein to discuss the time displacement of the delayed clock signal CLK_Q with respect to CLK_I for any embodiment, whether delay of CLK_Q with respect to CLK_I is true quadrature, approximately quadrature, or other than quadrature.

In some embodiments of the present invention, the clock-to-data delay of the data latches 302 may be suitably small such that delay compensation becomes unnecessary. In such cases, the delay compensation buffer may be omitted, thereby simplifying the circuitry while retaining the benefits imparted by the use of the fixed-delay (e.g. quadrature) clock for operating (e.g. clocking) the selector 305. In one embodiment where the clock-to-data delay of the latches 302 is suitably small, the use of a quadrature selector clock without the delay compensating buffer 301 retains the advantage that the timing margin of the selector clock relative to the data transitions is nearly maximized.

Although FIG. 3 depicts an embodiment using a quadrature clock, it is appreciated that clocks that generate signals other than quadrature but at some fixed delay relative to the in-phase clock can be used in a manner similar to that just described. In another embodiment, clock signal CLK_Q can be a fixed delay other than one-quarter clock cycle (e.g., other than 90 degrees). There are various ways to generate quadrature clock signals or clock signals other than quadrature with a fixed delay relative to another clock signal in phase with data signals. These are described in conjunction with FIGS. 4, 5, and 6.

The quadrature (or other fixed delay) relationship is rendered with accuracy, because deviations therefrom can adversely affect the corresponding timing margin. For instance, in an embodiment utilizing a quadrature-based delay, a deviation from a precise quadrature relationship between the delay clock signal and the in-phase clock signal can reduce the resulting timing margin of the multiplexer.

Referring to FIG. 4, a pair 400 of coupled oscillators 401 and 402 generate an in-phase clock, CLK_I, and a fixed-delay clock signal CLK_Q in one embodiment. Such fixed-delay clock generation by coupled oscillators can be implemented as taught by U.S. Pat. No. 6,188,292, which is incorporated herein by reference as explanatory material only.

In another embodiment, a clock signal with a fixed delay relative to an in phase clock such as a quadrature clock signal is generated by an alternative technique. For instance, FIG. 5 depicts a clocking system 500, wherein a single clock 501 operates at twice the frequency of an in-phase clock signal CLK_I and an exemplary quadrature clock signal CLK_Q. The output signal 2CLK of clock 501 is applied to a "divide-by-two" circuit 502 to derive the in-phase and quadrature (or other fixed delay) clock signals at separate points. Although FIG. 5 depicts a divide-by-two circuit employing two interconnected data latches 502, other embodiments use alternative arrangements of circuit devices, as is known in the art.

In yet another embodiment, the technique used for generating the quadrature (or other fixed delay) clock is propagation delay. For instance, FIG. 6 depicts a clocking system 600 wherein in-phase clock signal CLK_I is provided on one line and is also delayed by routing through a section of transmission line 601 to render a second, delayed clock signal CLK_Q.

By selecting a particular length for section 601 appropriate to the speed of propagation of signal CLK_I, the delay relationship between signals CLK_I and CLK_Q is fixed at some desired value. The propagation delay of the transmission line section 601 itself thus provides the required fixed timing offset. By selecting a certain particular length for section 601 appropriate to the speed of propagation of signal CLK_I, the delay relationship between signals CLK_I and CLK_Q is fixed at, for instance, a quadrature-based value.

In consideration of the high speeds characterizing the propagation of signals in various transmission media, the length of section 601 can be quite large. However, this technique remains practical at high frequency data rates. At lower frequency data rates, other passive circuit networks comprising resistors, inductors, capacitors and other passive electrical elements can be used to provide a fixed delay in place of the transmission line section 601, as is known in the art. Other techniques for generating a clock signal having a fixed delay relative to an in-phase clock such as a quadrature clock can be used, as well.

Figure 7:
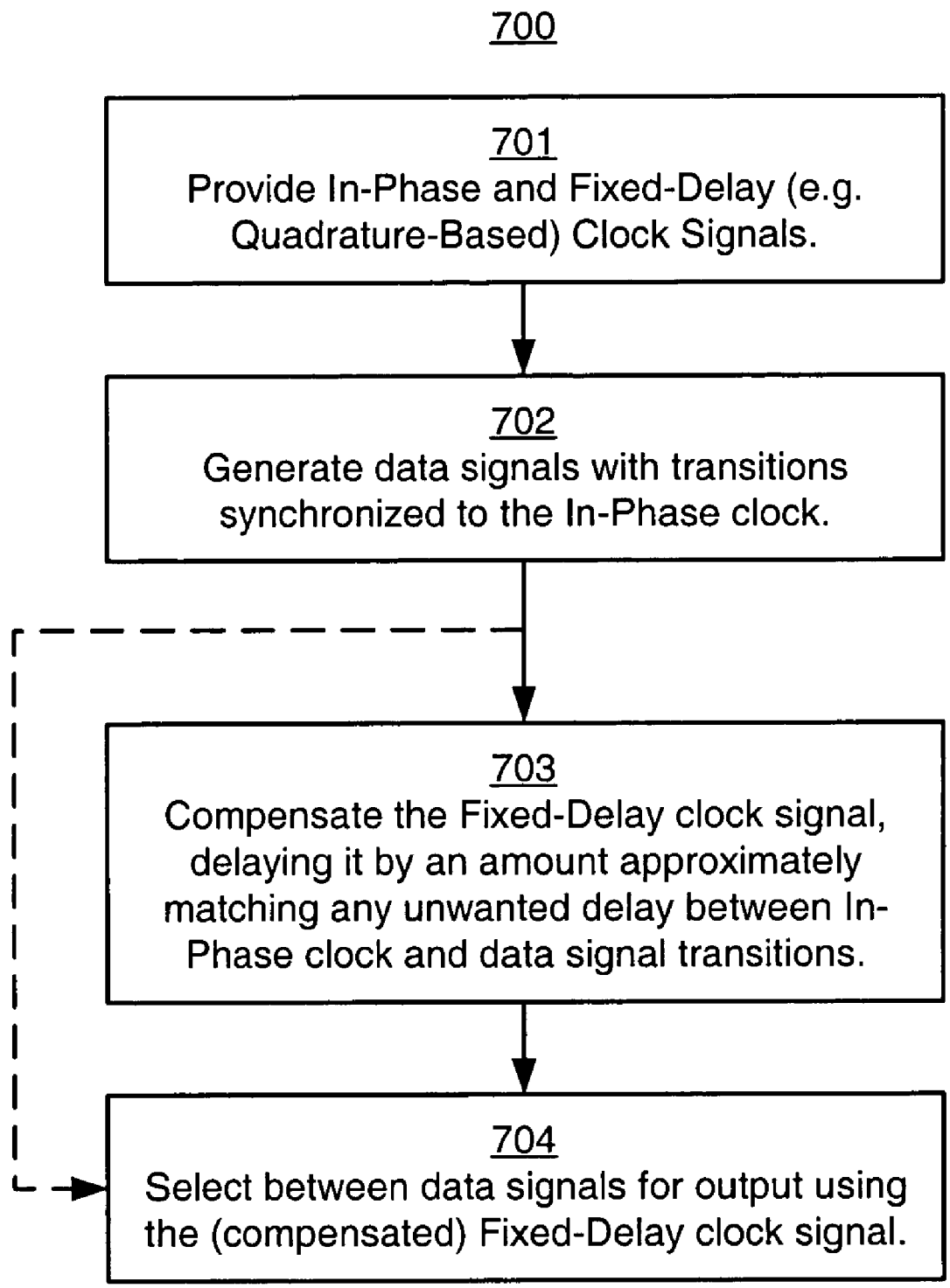
FIG. 7 is a flowchart of a process for multiplexing data, according to another embodiment of the present invention.

With reference to FIG. 7, a process 700 for multiplexing a plurality of data signals according to one embodiment of the present invention is described. Process 700 begins with step 701, wherein in-phase and fixed-delay clock signals are provided. These clock signals may be provided using techniques described in FIGS. 4-6, for example, or using other techniques known in the art. In one embodiment, the fixed-delay clock signal is a quadrature clock signal.

In step 702, data signals with transitions synchronized to the in-phase clock are generated. These data signals may be generated using flip-flops, latches (e.g. latches 302; FIG. 3), or similar registers or logic elements, or using other techniques that are known in the art. In practice, the process step 702 of generating these data signals may result in some unwanted time delay between the in-phase clock and the data signal transitions.

In step 703, any unwanted time delay is compensated for by delaying the fixed-delay clock signal by an amount approximately matching any unwanted time delay between in-phase clock and data signal transitions. This compensating delay may be generated using a variety of techniques known in the art. In one embodiment, the compensating delay is generated by passing the fixed-delay clock through a delay-compensating buffer (e.g. buffer 301; FIG. 3). In another embodiment, the compensating delay corresponds to a clock-to-data delay of a data latch used to generate the data signals in step 702. In some embodiments of the present invention, the unwanted time delay may be small enough that step 703 may be omitted.

In step 704, the compensated (if applicable), fixed-delay clock is used to select between data signals for output. In one embodiment, this selection can be effectuated by operating (e.g. clocking) a data signal selector (e.g. selector 305; FIG. 3) based on the delay-compensated fixed-delay (e.g. quadrature) clock signal. In another embodiment, wherein the unwanted delay between in-phase clock and data signal transitions is suitably small, the selection may employ the fixed-delay clock signal directly without further compensation.

In summary, embodiments of the present invention provide circuits and methods for multiplexing data that are capable of high speed operation with acceptable timing margins and reduced sensitivity to electrical and other variations that functions by compensating for clock-to-data delay in latch transitions in clocking a selector that sequentially selects data signals from those latches for output. The delay compensation can closely match the clock-to-data delay of the latches.

One embodiment provides a circuit and method for multiplexing capable of high speed operation with acceptable timing margins and reduced sensitivity to electrical and other variations that functions by clocking latch transitions with a first clock signal and clocking a selector that sequentially selects data signals from those latches for output with a second clock signal. The second clock signal has a fixed delay, relative to the first clock signal. In one embodiment, the second clock signal comprises a clock that is offset in time from the first clock by a quarter clock cycle (e.g., a quadrature clock). Thus, embodiments of the present invention function to cause multiplexer output signal selection transitions to occur during a period when a data signal is stable.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to explain the principles of the invention and its practical application, to thereby enable others skilled in the art to utilize the invention and various embodiments with various modifications as are suited to the particular use contemplated. It is intended that the scope of the invention be defined by the claims appended hereto and their equivalents.

What is claimed is:

1. A circuit for multiplexing a plurality of data signals into an output data stream comprising:
   a plurality of circuit elements, wherein a transition of each circuit element of said plurality of circuit elements is clocked by a first clock signal received from a source other than one of the plurality of circuit elements, wherein an output of each circuit element of said plurality of circuit elements comprises an individual data signal of said plurality of data signals and wherein said first clock signal is in-phase with said transition;
   a selector coupled to said plurality of circuit elements for receiving each of the individual output data signals from the plurality of circuit elements and for sequentially selecting each of said individual data signals to generate said output data stream as the output of the selector, wherein said selector is clocked to control said selecting by a second clock signal received from a source other than one of the plurality of circuit elements, wherein said second clock signal is out of phase with respect to said first clock signal by a fixed offset; and
   a compensator that is separate from the plurality of circuit elements coupled to said selector for compensating for a clock-to-data delay corresponding to said transition of each said circuit elements, wherein said second clock signal is transmitted to said selector through said compensator, and wherein said compensator retards said second clock signal to said selector by a compensating delay corresponding to said clock-to-data delay.

2. The circuit as recited in claim 1 wherein said fixed offset comprises a quadrature offset.

3. The circuit as recited in claim 1 wherein said fixed offset comprises a delay.

4. The circuit as recited in claim 3 wherein said delay comprises a quadrature delay.

5. The circuit as recited in claim 3 wherein said delay comprises a propagation delay.

6. The circuit as recited in claim 5 further comprising a section of a transmission medium coupled to said selector wherein said section comprises a particular length, wherein said particular length corresponds to said propagation delay.

7. The circuit as recited in claim 1 further comprising a clock generator coupled to said selector for generating said fixed offset.

8. The circuit as recited in claim 7 wherein said clock generator comprises a coupled oscillator circuit.

9. The circuit as recited in claim 7 wherein said clock generator comprises a divide-by-two circuit.

10. The circuit as recited in claim 1 wherein a part of said plurality of circuit elements comprises a flip-flop.

11. In a circuit comprising a plurality of circuit elements each for providing a data signal with transitions in response to a clock signal and a selector coupled to said plurality of circuit elements for selecting said data signals for an output data stream, a method for multiplexing a plurality of said data signals into an output data stream comprising:
   providing first and second clock signals received from a source other than one of the plurality of circuit elements, wherein said second clock signal is out-of-phase with respect to said first clock signal by a fixed offset;
   clocking said circuit elements with said first clock signal to control said transitions of said data signal;
   clocking said selector with said second clock to sequentially select a plurality of said data signals that are received as input for the selector for said output data stream and wherein said second clock is received as a separate input from the plurality of said data signals; and
   delaying said second clock signal by a compensating delay corresponding to a delay from said first clock signal to said transitions of said circuit elements.

12. The method as recited in claim 11 wherein said fixed offset comprises a quadrature offset.

13. The method as recited in claim 11 wherein said fixed offset comprises a delay.

14. The method as recited in claim 13 wherein said delay comprises a quadrature delay.

15. The method as recited in claim 13 wherein said delay is generated by a clock generator coupled to said selector.

16. The method as recited in claim 15 wherein said clock generator comprises a coupled oscillator circuit.

17. The method as recited in claim 15 wherein said clock generator comprises a divide-by-two circuit.

18. The method as recited in claim 13 wherein said delay comprises a propagation delay.

19. The method as recited in claim 18 further comprising a section of a transmission medium coupled to said selector wherein said section comprises a particular length, wherein said particular length corresponds to said propagation delay.

20. A system for multiplexing a plurality of data signals into an output data stream comprising:
   a plurality of circuit elements, wherein a transition of each circuit element of said plurality of circuit elements is clocked by a first clock signal received from a source other than one of the plurality of circuit elements, wherein an output of each circuit element of said plurality of circuit elements comprises an individual data signal of said plurality of data signals and wherein said first clock signal is in-phase with said transition;
   a selector coupled to said plurality of circuit elements for receiving each of the individual output data signals from the plurality of circuit elements and for sequentially selecting each of said individual data signals to generate said output data stream as the output of the selector, wherein said selector is clocked to control said selecting by a second clock signal received from a source other than one of the plurality of circuit elements, wherein said second clock signal is out of phase with respect to said first clock signal by a fixed quadrature delay; and a compensator that is separate from the plurality of circuit elements coupled to said selector for compensating for a clock-to-data delay corresponding to said transition of each said circuit elements, wherein said second clock signal is transmitted to said selector through said compensator, and wherein said compensator retards said second clock signal to said selector by a compensating delay corresponding to said clock-to-data delay.

21. The system as recited in claim 20 further comprising a clock generator coupled to said selector for generating said fixed quadrature delay.

22. The system as recited in claim 21 wherein said clock generator comprises a circuit selected from the group consisting essentially of a coupled oscillator circuit and a divide-by-two circuit.

23. The system as recited in claim 21 wherein said quadrature delay comprises a propagation delay.

24. The system as recited in claim 23 wherein said clock generator comprises a section of a transmission medium coupled to said selector wherein said section comprises a particular length, wherein said particular length corresponds to said propagation delay.

25. The system as recited in claim 20 wherein a part of said plurality of circuit elements comprises a flip-flop.

* * * * *